United States Patent [19]

Fromm et al.

[11] Patent Number: 5,321,697
[45] Date of Patent: Jun. 14, 1994

[54] SOLID STATE STORAGE DEVICE

[75] Inventors: Eric C. Fromm; Michael L. Anderson, both of Eau Claire; Lonnie R. Heidtke, Chippewa Falls, all of Wis.

[73] Assignee: Cray Research, Inc., Eagan, Minn.

[21] Appl. No.: 890,026

[22] Filed: May 28, 1992

[51] Int. Cl.$^5$ .............................................. G06F 11/00
[52] U.S. Cl. .................... 371/10.1; 395/425; 371/10.2; 371/10.3; 364/964.6; 364/964.7
[58] Field of Search .................. 371/10.1, 10.2, 10.3, 371/11.1; 364/246.3, 246.4, 246, 964.6, 964.7, 964.9, 964.8, 946.1, 245.3, 245.4, 268.5; 395/425

[56] References Cited

U.S. PATENT DOCUMENTS

| | | | |
|---|---|---|---|
| 4,172,282 | 10/1979 | Aichelmann et al. | 364/964 |
| 4,584,681 | 4/1986 | Singh et al. | 371/10.1 |
| 4,584,682 | 4/1986 | Shah et al. | 371/10.1 |
| 4,630,230 | 12/1986 | Sundet | 395/425 |
| 4,845,664 | 7/1989 | Aichelmann, Jr. et al. | 364/964 |
| 4,951,246 | 8/1990 | Fromm et al. | 395/425 |
| 5,150,328 | 9/1992 | Aichelmann, Jr. | 395/425 |

FOREIGN PATENT DOCUMENTS 0096779  12/1983  European Pat. Off. .
2480981  10/1981  France .

OTHER PUBLICATIONS

Patent Abstracts of Japan, vol. 010, No. 170 (E-412); Jun. 17, 1986 & JP,A,61 020 435 (Nippon Denshin Denwa Kosha) Jan. 29, 1986.

Primary Examiner—Robert W. Beausoliel, Jr.
Assistant Examiner—Trinh Tu
Attorney, Agent, or Firm—Daniel J. Kluth

[57] ABSTRACT

An improved solid state storage device (SSD) with memory organized into a plurality of groups, each group including a plurality of ranks, and each rank having at least two banks sharing a bidirectional data bus. A matrix reorder circuit is used to distribute data across individual memory components in a way that prevents multibit uncorrectable or undetectable errors due to the failure of a single memory component. The matrix reorder circuit is used for both reading and writing data, and operates on a stream of pipelined data of arbitrary length.

According to another aspect of this invention, a flaw map and additional hot spare memory are used to electrically replace failing memory components in the According to another aspect of this invention, memory in a bank is accessed during one half of a reference cycle and refreshed during the second half of the reference cycle, each bank being 180 degrees out of phase with the other so that a read or write is performed on one bank while a memory refresh is performed on the other bank.

16 Claims, 7 Drawing Sheets

SOLID STATE STORAGE DEVICE

FIELD OF THE INVENTION

The present invention pertains to the field of solid state storage devices, and more particularly to the field of add-on high speed solid state storage devices.

BACKGROUND OF THE INVENTION

In recent years advancements in integrated circuit technology have enabled development of memory chips of greatly increased capacity, reducing the cost per unit for solid state storage devices (SSDs). Because of the cost reductions and the greatly reduced space requirements, SSDs have become increasingly popular as an alternative or supplement to magnetic storage devices such as tapes or disk drives, particularly in I/O bound processing systems. U.S. Pat. No. 4,630,230, issued Dec. 16, 1986, to Sundet, describes an SSD utilizing an organization which minimizes data fan in and fan out and addressing fan out requirements. The storage section is organized into two groups, each group including a plurality of sections. Each section provided includes eight banks, paired in modules. The addressing and data is provided to the two groups identically so that each group receives one word each clock cycle. A pipeline technique of data distribution is employed, where data words are supplied to a first section in each group and transferred section to section on each succeeding clock cycle until all sections have a word and may be written into storage simultaneously. In the case of a write operation, words are captured from the sections simultaneously and passed out of the memory section to section. Refresh operations are accomplished on a periodic basis and a plurality of power supplies are provided for the storage modules in order to distribute refresh current demand over time and between the power supplies, providing for a safe and speedy refresh operation.

U.S. Pat. No. 4,951,246, issued Aug. 21, 1990, to Fromm et al., teaches a nibble-mode dynamic random access memory (DRAM) SSD utilizing the general concept of pipelining as described in U.S. Pat. No. 4,630,230, issued Dec. 16, 1986, to J. Sundet. Memory is organized into sections, with each section including a plurality of groups. Each group is organized into a plurality of ranks, with each rank including a pair of banks. Each group includes addressing circuitry shared between the two banks, each of which may be independently controlled, one at a time. Nibble-mode DRAM is deployed in each bank, and the addressing circuitry is adapted to address the DRAM in Nibble-mode cycles.

A plurality of ports into the SSD are provided, with each port having an independent data path to each section of the memory. Each section includes steering logic to direct data flow from a path into the group being accessed. An assembly register is provided for the group of ranks in a group, and includes a plurality of segments with data storage locations, with one segment for each rank. The assembly register is configured to receive data words in a pipeline fashion, which are in turn transferred from the assembly register into a write data register, which includes a plurality of locations corresponding to the locations in the assembly register. The data words are transferred from the write register into the memory under the control of the addressing circuitry. In a read operation, the ranks are accessed to simultaneously produce a plurality of data words, which are loaded in parallel into a read data register which is configured to pipeline the data to a data path out to a port.

The designers of modern storage devices have a number of requirements which include maximizing the capacity of a device to store data, maximizing the data transfer rate into and out of the device, maximizing reliability, and minimizing cost.

In light of these requirements, there is a need to provide for a fast way of distributing data across individual memory components in a way that prevents multibit uncorrectable or undetectable errors due to the failure of a single memory component.

There is a further need to provide for an easy way of logically replacing a failed memory component.

There is a further need to provide for a way of distributing power comsumption evenly across the device to eliminate the need for special load regulation of the power supply.

There is a further need to provide for a way of eliminating the time required to wait while memory is being refreshed.

SUMMARY OF THE INVENTION

The present invention provides for an improved solid state storage device (SSD) with memory organized into a plurality of groups, each group including a plurality of ranks, and each rank having at least two banks sharing a bidirectional data bus. A matrix reorder circuit is used to distribute data across individual memory components in a way that prevents multi-bit uncorrectable or undetectable errors due to the failure of a single memory component. The matrix reorder circuit is used for both reading and writing data, and operates on a stream of pipelined data of arbitrary length.

According to another aspect of this invention, a flaw map and additional hot spare memory are used to electrically replace failing memory components in the banks.

According to another aspect of this invention, memory in a bank is accessed during one half of a reference cycle and refreshed during the second half of the reference cycle, each bank being 180 degrees out of phase with the other so that a read or write is performed on one bank while a memory refresh is performed on the other bank.

DETAILED DESCRIPTION OF THE PREFERRED EMBODIMENTS

In the following detailed description of the preferred embodiments, reference is made to the accompanying drawings which form a part hereof, and in which is shown by way of illustration specific embodiments in which the invention may be practiced. It is to be understood that other embodiments may be utilized and structural changes may be made without departing from the scope of the present invention.

The solid state storage device (SSD) of the present invention is designed by the assignee, Cray Research, for use with a Cray Y-MP supercomputer. The present SSD provides for pipelining memory access in a manner similar to that described in U.S. Pat. No. 4,630,230, issued Dec. 16, 1986, to J. W. Sundet, which is hereby incorporated by reference. Data can be written to or read from the memory of the present SSD through multiple data ports as taught by U.S. Pat. No. 4,951,246, issued Aug. 21, 1990, to Fromm et al., which is hereby incorporated by reference.

The present invention is implemented with 1 megabit by 4 bit wide DRAM memory components. A 32 word block of 72 bit words, 64 bits for data and 8 bits for single error correction double error detection (SECDED), is presented on an external data port and can be written to or read from the storage device in pipeline fashion. The 8 bits for SECDED allows the device to correct single-bit errors and detect multi-bit errors due to failing components.

Figure 1:
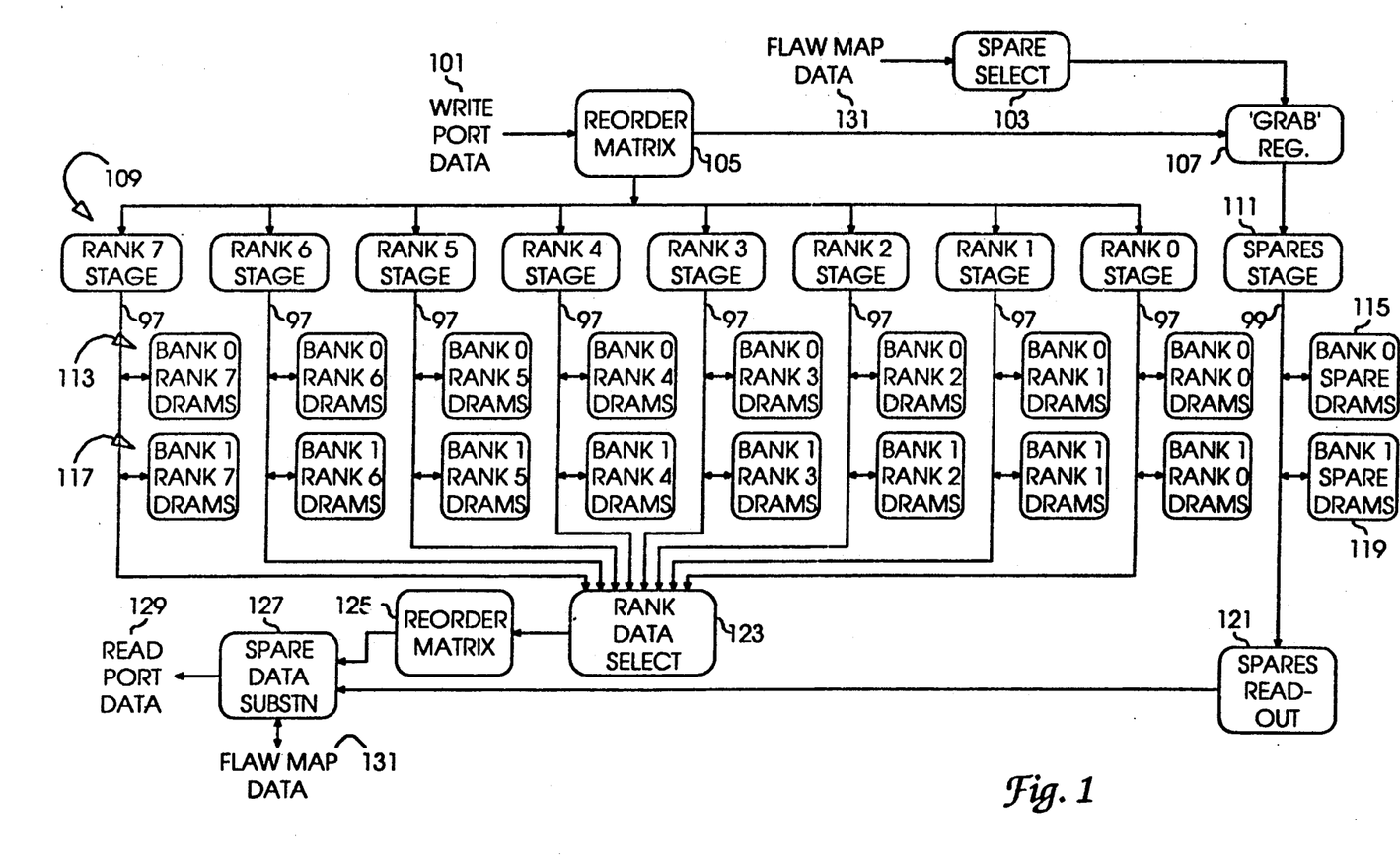
FIG. 1 is a block diagram of the overall organization of a hardware portion of an improved SSD compatible with the present invention.

The overall organization of a preferred apparatus for a memory group of an improved SSD is shown in FIG. 1. Write port data 101 in the form of input data blocks having a fixed size is routed from an external data port to a write reorder matrix 105. The spare select circuitry 103 determines if any data should be simultaneously routed to the hot-spare DRAM memory. From the write reorder matrix 105, the reordered data words are distributed among the rank 0-7 stages 109 which routes the data to bank 0 of DRAM semiconductors 113 and bank 1 of DRAM semiconductors 117 via a bidirectional data bus 97.

Data is read from the improved SSD from either the bank 0 DRAM semiconductors 113 or the bank 1 DRAM semiconductors 117 through rank data select 123. Data is then routed through the read reorder matrix 125 to be reordered into words, and hot-spare data is substituted if necessary by hot-spare data substitution 127. Hot-spare data is read from either the bank 0 hot-spare DRAM semiconductors 115 or the bank 1 hot-spare DRAM semiconductors 119 through spares readout 121 to hot-spare data substitution 127. The original format read port data is then output at 129. Flaw map information in hot-spare data substitution 127 and spare select 103 is updated by flaw map data 131 containing a flaw map of the DRAM semiconductors 113 and 117.

In order to guard against multi-bit uncorrectable errors, each DRAM stores the same bit from four consecutive words at the same address. If a particular DRAM fails, only a single bit from multiple words is affected, and those single bits can be corrected by the 8 bits of SECDED data that are stored with each 64 bit word. Incoming data is reordered by a write reorder matrix circuit so that the same bit from different words is stored in the same DRAM, which has the effect that the bits from the same word of data are stored in physically separate DRAMs.

Figure 2A:
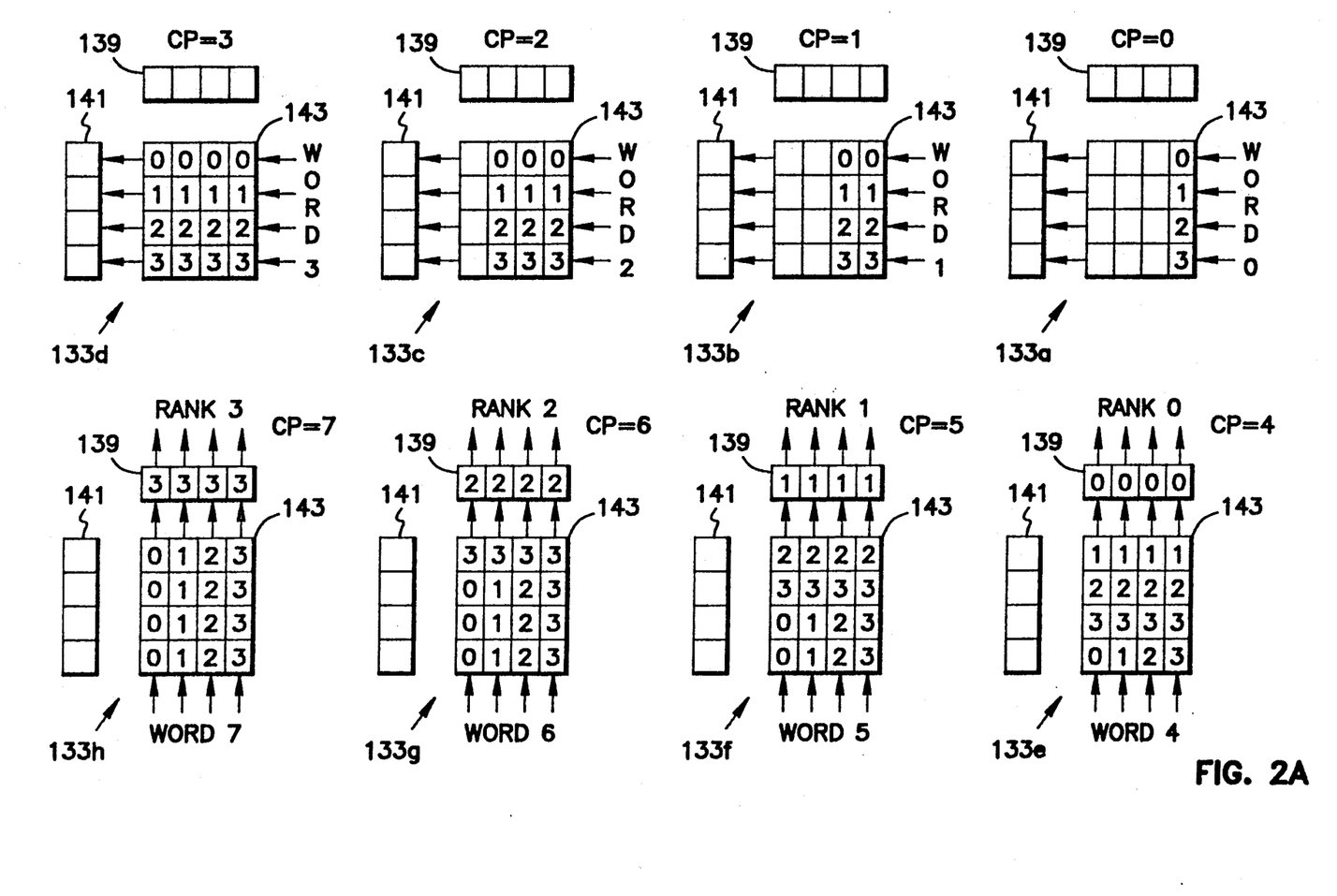
FIGS. 2a and 2b taken together are a block diagram showing the sequence of operation of a write reorder matrix circuit compatible with the present invention.
Figure 2B:
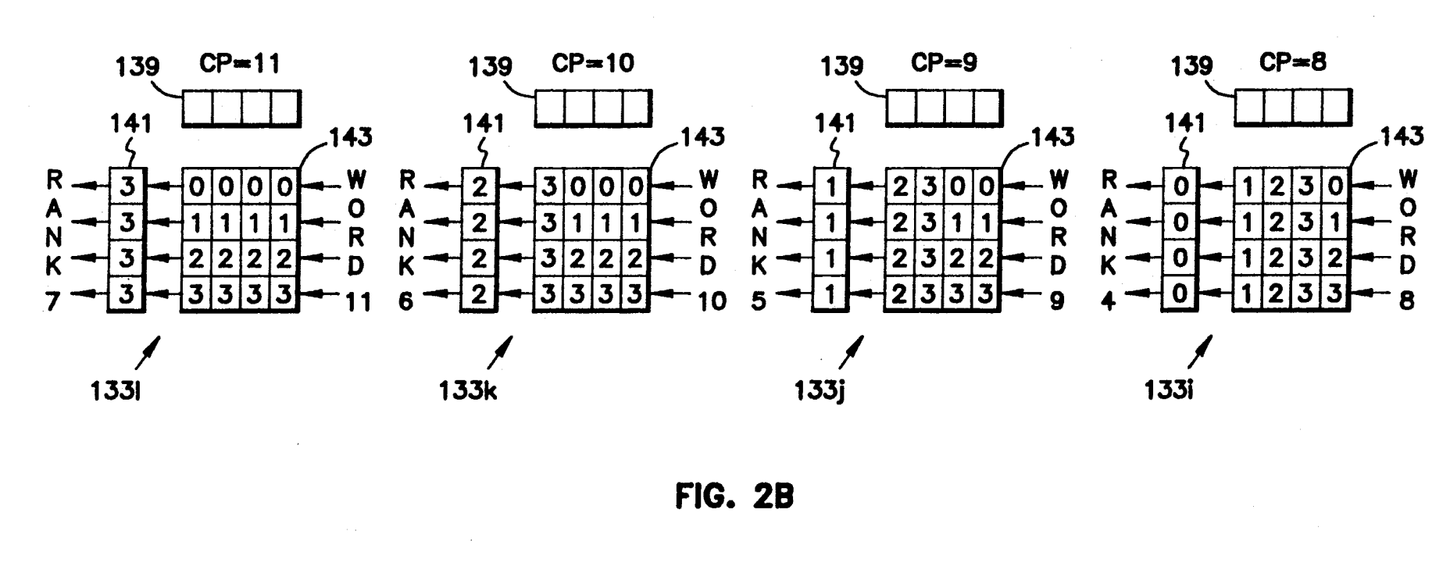

A typical write data reordering sequence for eight 4-bit words is revealed in FIG. 2. At 133a, clock period 0, a first partial word of write data (word 0) is presented to the right side of a write reorder matrix register 143. At 133b through 133d, clock periods 1 through 3, the contents of the write reorder matrix register 143 are shifted left one position each clock period, while simultaneously the next three partial words of write data (word 1 through word 3) are presented to the right side of the write reorder matrix register 143, one partial word each clock period, until the write reorder matrix register 143 is filled.

At 133e through 133h, clock periods 4 through 7, the contents of the write reorder matrix register 143 are shifted up one position each clock period and presented at the top in a first output buffer 139 as reordered partial words for ranks 0 through 3, while simultaneously the next four partial words (word 4 through word 7) of write data are presented to the bottom of the write reorder matrix register 143, one partial word each clock period, keeping the write reorder matrix register 143 filled.

At 133i through 133l, clock periods 8 through 11, the contents of the write reorder matrix register 143 are shifted left one position each clock period and presented at the left in a second output buffer 141 as reordered partial words for ranks 4 through 7, while simultaneously the next four words (word 8 through word 11) of write data are presented to the right of the write reorder matrix register 143, one partial word each clock period, keeping the write reorder matrix register 143 filled. For write data streams longer than eight words, the reordering sequence continues with the shift of the contents of the write reorder matrix register 143 changing direction every four words, until all data words in the write data stream have been written.

Figure 3A:
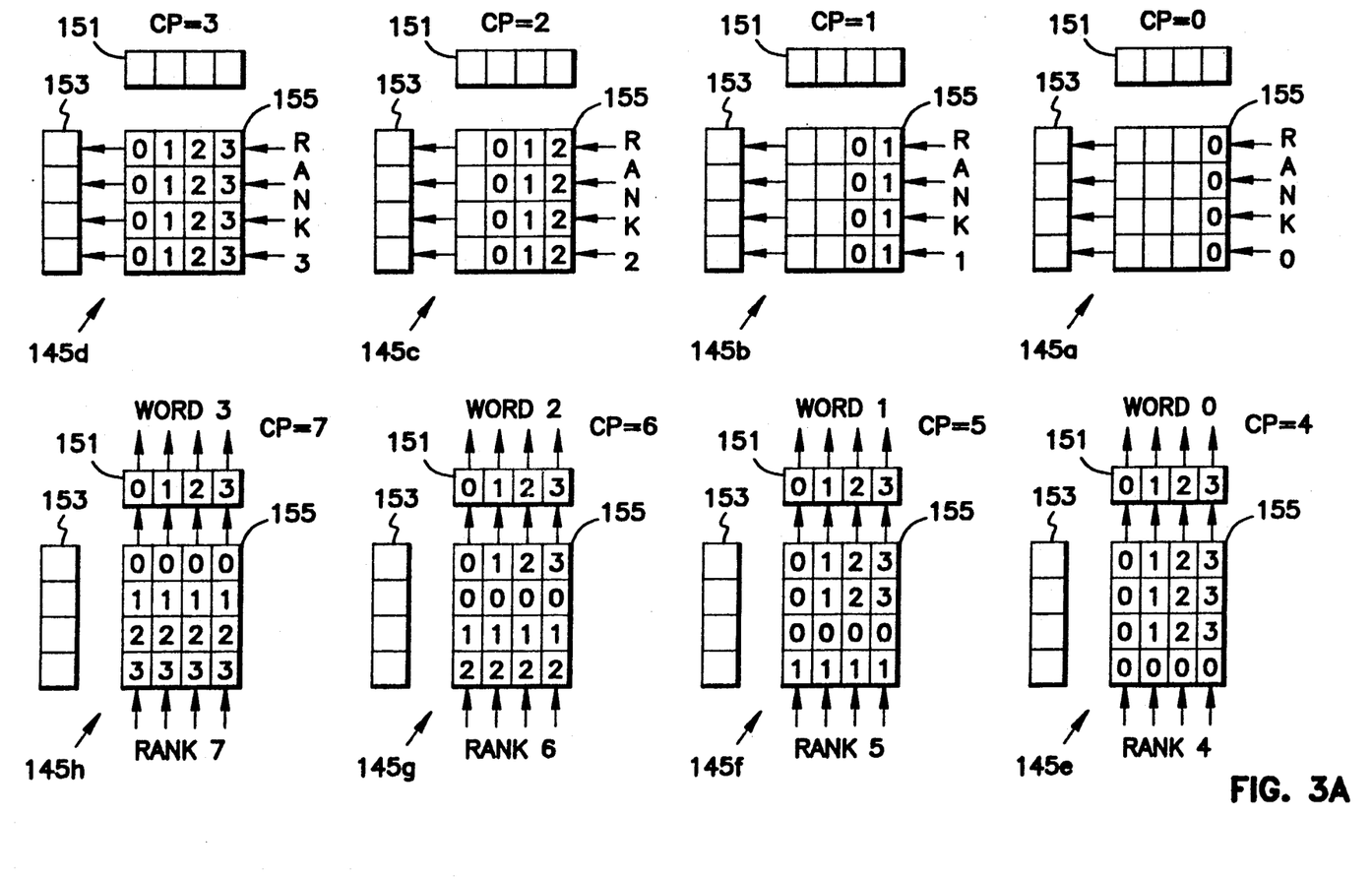
FIGS. 3a and 3b taken together are a block diagram showing the sequence of operation of a read reorder matrix circuit compatible with the present invention.
Figure 3B:
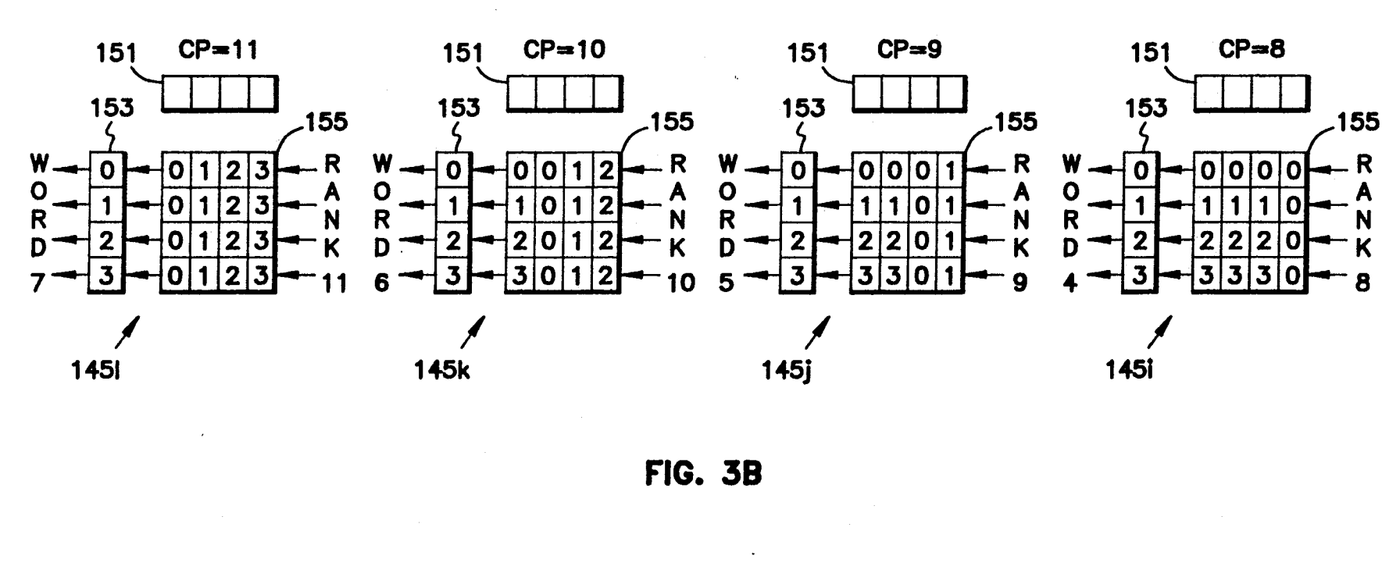

A typical read data reordering sequence for eight 4-bit words is illustrated in FIG. 3. At 145a, clock period 0, a first partial rank of read data (rank 0) is presented to the right side of a read reorder matrix register 155. At 145b through 145d, clock periods 1 through 3, the contents of the read reorder matrix register 155 are shifted left one position each clock period, while simultaneously the next three partial ranks of read data (rank 1 through rank 3) are presented to the right of the read reorder matrix register 155, one partial rank each clock period, until the read reorder matrix register 155 is filled.

At 145e through 145h, clock periods 4 through 7, the contents of the read reorder matrix register 155 are shifted up one position each clock period and presented at the top in a first output buffer 151 as original format words 0 through 3, while simultaneously the next four partial ranks (rank 4 through rank 7) of read data are presented to the bottom of the read reorder matrix register 155, one partial rank each clock period, keeping the read reorder matrix register 155 filled.

At 145i through 145l, clock periods 8 through 11, the contents of the read reorder matrix register 155 are shifted left one position each clock period and presented at the left in a second output buffer 153 as reordered partial ranks for words 4 through 7, while simultaneously the next four ranks (rank 8 through rank 11) of read data are presented to the right of the read reorder matrix register 155, one partial rank each clock period, keeping the rank matrix register 155 filled. For read data streams longer than eight words, the reordering sequence continues with the shift of the contents of the read reorder matrix register 155 changing direction every four words, until all data words in the read data stream have been read.

Those skilled in the art will recognize that the write reorder matrix and read reorder matrix registers may comprise substantially the same form of circuit, and may be modified such that data words of any commonly used length may be written to and read from memory. It will also be recognized that the relative directions of the data transfers within the write reorder matrix and read reorder matrix registers may be changed and still retain equivalency with the present invention.

Figure 4:
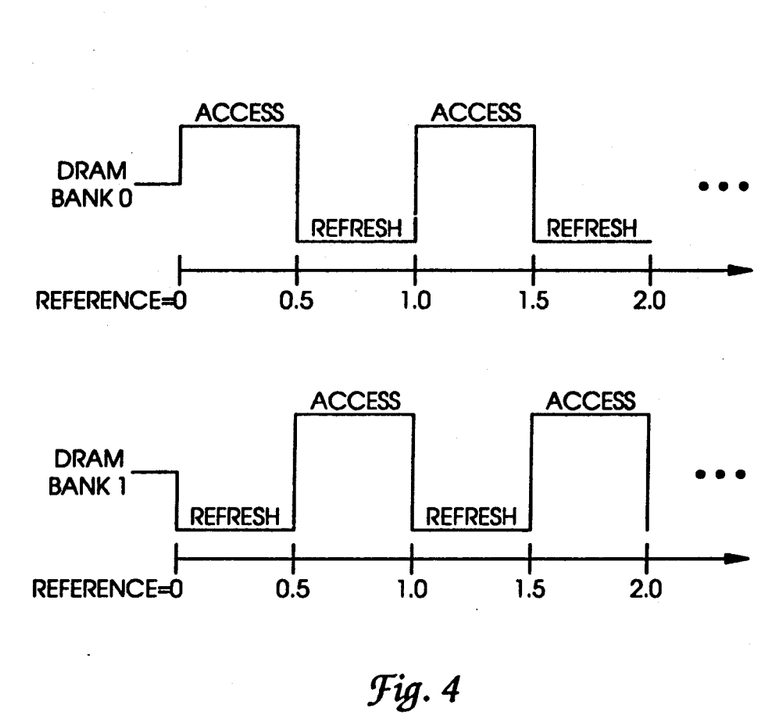
FIG. 4 is a timing diagram of a memory reference cycle compatible with the present invention.

FIG. 4 describes a typical memory reference cycle. The first half of memory reference cycle 0 accesses bank 0 DRAMs while simultaneously refreshing bank 1 DRAMs. The second half of memory reference cycle 0 refreshes bank 0 DRAMs while simultaneously accessing bank 1 DRAMs. Subsequent memory reference cycles continue to access bank 0 DRAMs and refresh bank 1 DRAMs during the first half of the cycle and refresh bank 0 DRAMs and access bank 1 DRAMs during the second half of the cycle. Memory referencing is continuous upon power up of the device. If the device does not need to write or read memory, the control circuitry provides read reference signals during the access portion of the reference cycle, but the read reorder matrices ignore the read data sent by the memory devices. This method of accessing memory allows the two DRAM banks to share a common bidirectional data bus while also allowing read and write access to both DRAM banks during the same memory reference cycle as each DRAM bank is 180 degrees out of phase with the other.

The reference activity to the memory ranks are phased one clock period apart. This allows pipelined operation of the main data paths. For example, a 32 word block of data is written to or read from memory in 32 consecutive clock periods. The continuous referencing and the phasing of the referencing also distributes the power bus transients created when the DRAMs are accessed, thus minimizing system noise and eliminating the requirement for special load regulation of the power supply.

Figure 5:
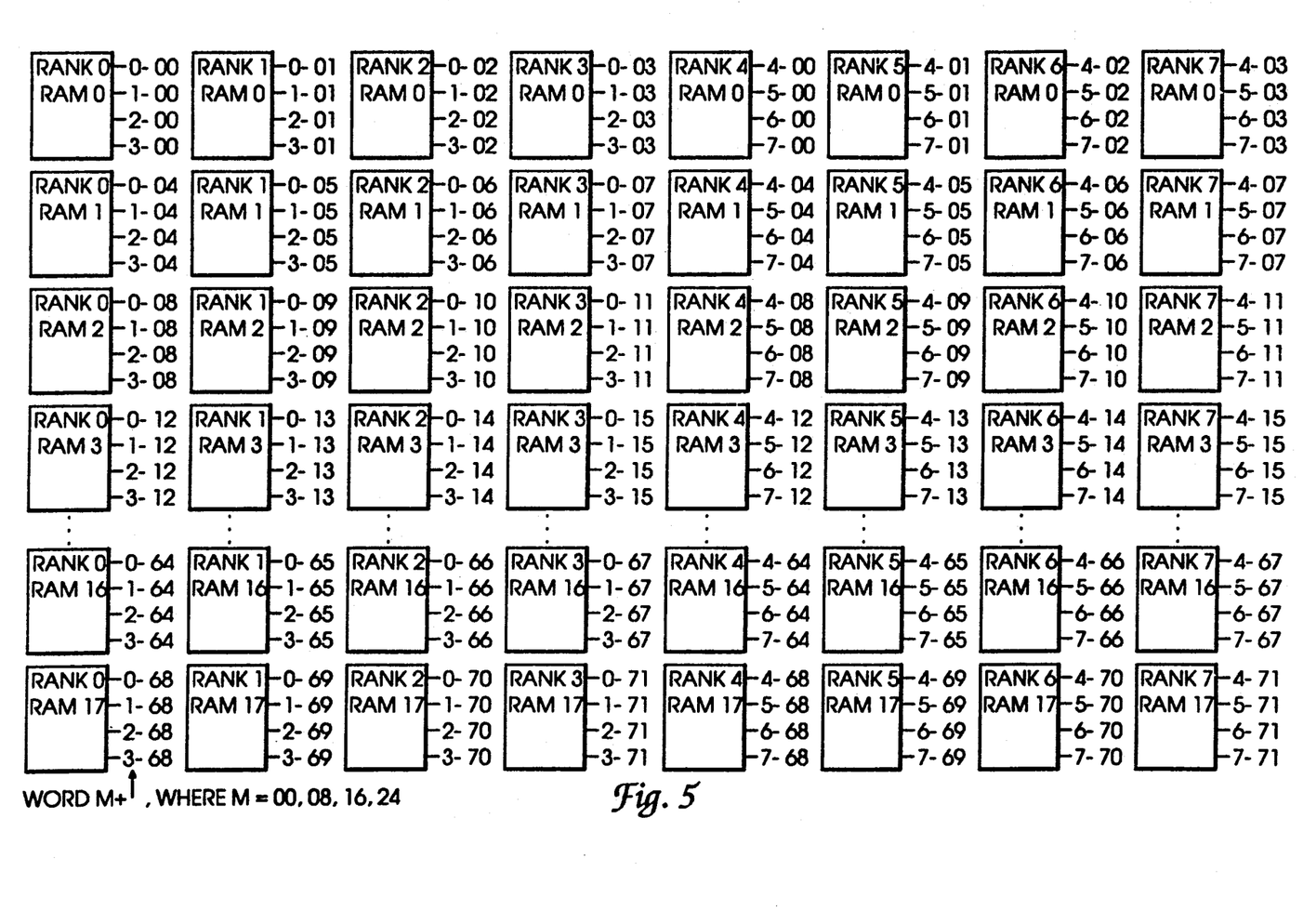
FIG. 5 is a block diagram of the bit assignments of an improved SSD compatible with the present invention.

FIG. 5 shows the bit assignments for one bank of one group of memory for an improved SSD. Each bank comprises eight ranks, each rank comprises 18 DRAM chips, each DRAM chip being 4 bits wide and capable of storing 4×1 megabits of data. Therefore, each rank is capable of storing 4×72 megabits of data, with 64 data bits and 8 bits SECDED. DRAM chips that are 8, 9, 16, and 18 bits wide along with other data widths may also be used and will affect the amount of data that can be stored accordingly. A write reorder matrix register reorders a block of write data such that each DRAM chip stores the same bit from different words at the same address. Thus, rank 0, DRAM chip 0 stores bit 00 of words 0 through 3; rank 0, DRAM chip 1 stores bit 04 of words 0 through 3; rank 1, DRAM chip 0 stores bit 01 of words 0 through 3; rank 1, DRAM chip 1 stores bit 05 of words 0 through 3, and so on. This eliminates multi-bit uncorrectable or undetectable errors due to the failure of a single DRAM component if different bits of the same word were stored at the same address.

The physical layout of an improved SSD includes jumper blocks placed next to the memory groups and gate arrays, with each of three memory groups having 16 columns, each column of memory having 12 DRAMs. Eighteen Motorola 6200 gate arrays are used to implement the matrix reorder, memory access, hot spare substitution circuits, and the hot spare memory map information. Hot spare memory contains four columns of memory, each column having 3 DRAMs. A clock synchronously provides a 6.25 nanosecond (nsec) clock fan out to the 6200 gate arrays. The 6200 gate arrays implement the matrix reorder and hot spare substitution circuits, allowing the SSD to electrically configure itself in response to external commands.

The present invention is to be limited only in accordance with the scope of the appended claims, since others skilled in the art may devise other embodiments still within the limits of the claims.

What is claimed is:

1. A solid state storage device, comprising:
  (a) input means for receiving input data in the form of input data blocks having a fixed size;
  (b) memory means having a plurality of memory devices for storing reordered write data blocks; and
  (c) write reorder matrix means, having a plurality of pipelines, for
    (1) receiving the input data blocks from the input means,
    (2) sequentially reordering the input data by transferring adjacent bits through a shift matrix in pipelined operation and distributing the bits across the memory devices of the memory means; and
    (3) producing the reordered write data blocks from the reordered input data.

2. The solid state storage device of claim 1 wherein the memory means further comprises:
  (a) additional memory means comprising hot spare memory devices to electrically replace at least one of the plurality of memory devices;
  (b) a flaw map of the memory means and the additional memory means;
  (c) memory replacement means connected to the flaw map for electrically replacing at least one of the plurality of memory devices with at least one of the hot spare memory devices; and
  (d) memory select means electrically connected to the write reorder matrix means and the additional memory means for reordering the input data by transferring adjacent bits of the input data blocks shifted through the shift matrix in pipelined operation and distributing the reordered bits across the memory devices of the additional memory means.

3. The solid state storage device of claim 2 wherein the memory means comprises:
  (a) two or more independent banks of DRAM semiconductor memory means for storing data blocks; and
  (b) bidirection data bus means for reading words out of and writing words into the memory means.

4. The solid state storage device of claim 3 wherein the device reads and writes a first bank of the memory means during a first half of a reference cycle and synchronously performs a memory refresh on a second bank of the memory means during the first half of the reference cycle, and reads and writes the second bank of the memory means during the second half of the reference cycle and synchronously performs a memory refresh on the first bank of the memory means during the second half of the reference cycle, such that at least one bank of the memory means is available for reading and writing at any time.

5. The solid state storage device of claim 4 wherein the write reorder matrix means further comprises:
  (a) a first output buffer for presenting a first reordered partial word;
  (b) a second output buffer for presenting a second reordered partial word;

(c) a shift matrix connected to the first and second output buffers having depth and having two ports;

(d) transfer means for transferring sequential partial words in pipeline fashion through the shift matrix to the first output buffer such that bits located in a first position within separate sequential partial words are reordered into sequential bits in a single word of the first output buffer; and (e) transfer means for transferring sequential partial words in pipeline fashion through the shift matrix to the second output buffer such that bits located in a second position within separate sequential partial words are reordered into sequential bits in a single word of the second output buffer.

6. The solid state storage device of claim 5 wherein the device comprises read reorder matrix means comprising the first output buffer, second output buffer, and the shift matrix of the write reorder matrix means.

7. A solid state storage device, comprising:
   (a) input means for receiving input data in the form of input data blocks having a fixed size;
   (b) main memory means having a plurality of memory ranks for storing reordered write data blocks,
      (1) each memory rank including at least on DRAM bank,
      (2) each DRAM bank including a plurality of DRAM semiconductors; and
   (c) write reorder matrix means, having a plurality of pipelines, for
      (1) receiving the input data blocks from the input means,
      (2) sequentially reordering the input data by transferring adjacent bits through a shift matrix in pipelined operation and distributing the bits across the memory ranks of the main memory means; and
      (3) producing the reordered write data blocks from the reordered input data.

8. The solid state storage device of claim 7 wherein the memory means further comprises:
   (a) additional memory means comprising a plurality of hot spare memory devices for electrically replacing failing DRAM semiconductors, each hot spare memory device including a plurality of DRAM semiconductors assigned to a portion of the DRAM semiconductors in the memory means;
   (b) a flaw map of the memory means and the additional memory means;
   (c) memory replacement means connected to the flaw map for electrically replacing at least one of the plurality of DRAM semiconductors in the memory means with at least one of the plurality of hot spare DRAM semiconductors; and
   (d) memory select means electrically connected to the write reorder matrix means and the additional memory means for reordering the input data by transferring adjacent bits of the input data blocks shifted through the shift matrix in pipelined operation and distributing the reordered bits across the memory devices of the additional memory means.

9. The solid state storage device of claim 8 wherein the memory means comprises:
   (a) two or more independent banks of DRAM semiconductor memory means for storing data blocks; and
   (b) bidirectional data bus means for reading words out of and writing words into the memory means.

10. The solid state storage device of claim 9 wherein the device reads and writes a first bank of the main memory means during a first half of a reference cycle and synchronously performs a memory refresh on a second bank of the main memory means during the first half of the reference cycle, and reads and writes the second bank of the main memory means during a second half of a reference cycle and synchronously performs a memory refresh on the first bank of the main memory means during the second half of the reference cycle, such that at least one bank of the main memory means is available for reading and writing at any time.

11. The solid state storage device of claim 10 wherein the write reorder matrix means further comprises:
   (a) a first output buffer for presenting a first reordered partial word;
   (b) a second output buffer for presenting a second reordered partial word;
   (c) a shift matrix connected to the first and second output buffers having depth of at least four words and having two ports;
   (d) transfer means for transferring at least four sequential partial words in pipeline fashion through the shift matrix to the first output buffer such that bits located in a first position within separate sequential partial words are reordered into sequential bits in a single word of the first output buffer; and
   (e) transfer means for transferring at least four sequential partial words in pipeline fashion through the shift matrix to the second output buffer such that bits located in a second position within separate sequential partial words are reordered into sequential bits in a single word of the second output buffer.

12. The solid state storage device of claim 11 wherein the device comprises read reorder matrix means comprising the first output buffer, second output buffer, and the shift matrix of the write reorder matrix means.

13. A solid state storage device, comprising:
   (a) input means for receiving input data in the form of input data blocks having a fixed size;
   (b) main memory means having a plurality of memory ranks for storing reordered write data blocks,
      (1) each memory rank including at least two DRAM banks,
      (2) each DRAM bank including a plurality of DRAM semiconductors,
      (3) the plurality of semiconductors connected to a tri-state TTL bidirectional data bus means for reading words out of and writing words into the main memory means;
   (c) write reorder matrix means, having a plurality of pipelines, for
      (1) receiving the input data blocks from the input means,
      (2) sequentially reordering the input data by transferring adjacent bits through a shift matrix in pipelined operation and distributing the bits across the memory ranks of the main memory means;
      (3) producing the reordered write data blocks from the reordered input data;
   (d) additional memory means comprising a plurality of hot spare memory devices for electrically replacing failing DRAM semiconductors, each hot spare memory device including a plurality of DRAM semiconductors assigned to a portion of the DRAM semiconductors in the main memory means;

(e) a flaw map of the main memory means and the additional memory means;

(f) memory replacement means connected to the flaw map for electrically replacing at least one of the plurality of DRAM semiconductors in the main memory means with at least one of the plurality of hot spare DRAM semiconductors;

(g) memory select means electrically connected to the write reorder matrix means and the additional memory means for reordering the input data by transferring adjacent bits of the input data blocks shifted through the shift matrix in pipelined operation and distributing the reordered bits across the memory devices of the additional memory means; and (h) maintenance port means for carrying flaw map information out of and into the memory replacement means.

14. The solid state storage device of claim 13 wherein the device reads and writes a DRAM bank during a first half of a reference cycle and performs a memory refresh on the DRAM bank during a second half of the reference cycle, each DRAM bank being 180 degrees out of phase with the other so that a read and write is performed on one DRAM bank while a memory refresh is synchronously performed on the other DRAM bank, such that at least one DRAM bank is available for reading and writing at any time.

15. The solid state storage device of claim 14 wherein the write reorder matrix means further comprises:

(a) a first output buffer for presenting a first reordered partial word;

(b) a second output buffer for presenting a second reordered partial word;

(c) a shift matrix connected to the first and second output buffers having depth of at least eight words and having two ports;

(d) transfer means for transferring at least eight sequential partial words in pipeline fashion through the shift matrix to the first output buffer such that bits located in the same position within separate sequential partial words are reordered into sequential bits in a single word of the first output buffer; and (e) transfer means for transferring at least eight sequential partial words in pipeline fashion through the shift matrix to the second output buffer such that bits located in the same position within separate sequential partial words are reordered into sequential bits in a single word of the second output buffer.

16. The solid state storage device of claim 15 wherein the device comprises read reorder matrix means comprising the first output buffer, second output buffer, and the shift matrix of the write reorder matrix means.

* * * * *

UNITED STATES PATENT AND TRADEMARK OFFICE
CERTIFICATE OF CORRECTION

PATENT NO. : 5,321,697
DATED : June 14, 1994
INVENTOR(S) : Eric C. Fromm et al.

It is certified that error appears in the above-indentified patent and that said Letters Patent is hereby corrected as shown below:

Column 6, line 57-58, please delete "the second half of the reference" and insert --a second half of a reference-- therefore.

Signed and Sealed this

Thirty-first Day of October 1995

BRUCE LEHMAN

Attest:

Attesting Officer

Commissioner of Patents and Trademarks